United States Patent
Ohara et al.

(10) Patent No.: US 11,725,301 B2
(45) Date of Patent: Aug. 15, 2023

(54) METHOD FOR MANUFACTURING CRYSTAL FOR SYNTHETIC GEM

(71) Applicant: BRILLAR CO., LTD., Tokyo (JP)

(72) Inventors: Iso Ohara, Tokyo (JP); Tsunenobu Kimoto, Kyoto (JP)

(73) Assignee: BRILLAR CO., LTD., Tokyo (JP)

(*) Notice: Subject to any disclaimer, the term of this patent is extended or adjusted under 35 U.S.C. 154(b) by 0 days.

(21) Appl. No.: 17/535,787

(22) Filed: Nov. 26, 2021

(65) Prior Publication Data
US 2022/0251729 A1 Aug. 11, 2022

(30) Foreign Application Priority Data
Feb. 5, 2021 (JP) ................. 2021-017259

(51) Int. Cl.
*C30B 29/36* (2006.01)
*C30B 33/04* (2006.01)

(52) U.S. Cl.
CPC ............. *C30B 29/36* (2013.01); *C30B 33/04* (2013.01)

(58) Field of Classification Search
None
See application file for complete search history.

(56) References Cited

U.S. PATENT DOCUMENTS

| | | | |
|---|---|---|---|
| 5,718,760 A | 2/1998 | Carter et al. | |
| 5,762,896 A | 6/1998 | Hunter et al. | |
| 5,882,786 A | 3/1999 | Nassau et al. | |
| 6,025,289 A | 2/2000 | Carter et al. | |
| 2005/0126471 A1* | 6/2005 | Jenny | C30B 33/00 117/92 |
| 2008/0026544 A1 | 1/2008 | Tsuchida et al. | |
| 2009/0039358 A1* | 2/2009 | Tsuchida | H01L 29/7325 257/77 |

FOREIGN PATENT DOCUMENTS

| | | |
|---|---|---|
| JP | H11-507906 A | 7/1999 |
| JP | 2000-503968 A | 4/2000 |
| JP | 2001-503726 A | 3/2001 |
| JP | 2008-053667 A | 3/2008 |

OTHER PUBLICATIONS

Hazdra et al., Phys. Status Solidi A 2019, 276, 1900312 (Year: 2019).*
Firsov et al., "Evaluation of nitrogen incorporation into bulk 4H-SiC grown on seeds of different orientation from optical absorption spectra", Journal of Physics: Conference Series 741, 012043 (Year: 2016).*

* cited by examiner

*Primary Examiner* — Hua Qi
(74) *Attorney, Agent, or Firm* — Maschoff Brennan

(57) ABSTRACT

The method for manufacturing a crystal for a synthetic gem includes the step of preparing a SiC single crystal including an n-type impurity, and the step of irradiating the SiC single crystal with an electron beam to generate a carbon vacancy in the SiC single crystal. Irradiation energy and dose in electron beam irradiation are set such that the density of the carbon vacancy is higher than the density of the n-type impurity.

2 Claims, 7 Drawing Sheets

METHOD FOR MANUFACTURING CRYSTAL FOR SYNTHETIC GEM

CROSS-REFERENCE TO RELATED APPLICATIONS

This claims priority to Japanese Patent Application No. 2021-017259 filed on Feb. 5, 2021. The entire disclosures of these applications are incorporated by reference herein.

BACKGROUND

The present disclosure relates to the method for manufacturing a synthetic gem crystal including a SiC single crystal having an n-type impurity.

Silicon carbide (SiC) has been used as a semiconductor device material, and has been also highly evaluated as a useful shining synthetic gem because of a high hardness and a high refractive index.

However, a SiC single crystal ingot which can be commercially utilized as the base of a SiC wafer for manufacturing a semiconductor device is normally doped with nitrogen as an n-type impurity for the purpose of reducing resistance. The SiC single crystal has a wide bandgap (Eg =3.26 eV), and therefore, is colorless clear under normal conditions. However, the SiC single crystal ingot doped with the n-type impurity is colored (in the color of amber). For this reason, a synthetic gem produced by cutting of such a SiC single crystal ingot cannot sufficiently exhibit the inherent value of the synthetic gem.

On the other hand, it is difficult to manufacture a high-purity SiC single crystal ingot, and a cost for such manufacturing is extremely high. For this reason, it is difficult to provide the synthetic gem at a reasonable cost.

Japanese Unexamined Patent Application Publication (Translation of PCT Application) No. 2000-503968 discloses the method for providing a colorless SiC single crystal in such a manner that a SiC single crystal doped with an n-type impurity is further doped with a p-type impurity having the same level of density as that of the n-type impurity to compensate for the n-type impurity.

SUMMARY

The method disclosed in Japanese Unexamined Patent Application Publication (Translation of PCT Application) No. 2000-503968 can change the SiC single crystal doped with the n-type impurity into the colorless SiC single crystal, but it is technically difficult to dope, with favorable reproducibility, the same level of density of the p-type impurity as that of the n-type impurity to the entirety of the growing SiC single crystal. Particularly, at the initial stage of crystal growth or the last half of the crystal growth over a long period of time, the amounts of both n-type and p-type impurities to be taken in greatly vary. For this reason, there is a problem that a region to be colorless clear is limited.

The present disclosure is intended to provide the method for manufacturing, at a relatively-low cost, a shining colorless clear synthetic gem crystal including a SiC single crystal having an n-type impurity.

The synthetic gem crystal manufacturing method according to the present disclosure includes the step of preparing a SiC single crystal including an n-type impurity and the step of irradiating the SiC single crystal with an electron beam to generate a carbon vacancy in the SiC single crystal. Irradiation energy and dose in electron beam irradiation are set such that the density of the carbon vacancy is higher than the density of the n-type impurity.

According to the present disclosure, the shining colorless clear synthetic gem crystal including the SiC single crystal having the n-type impurity can be provided at a relatively-low cost, and the method for manufacturing such a synthetic gem crystal can be also provided.

DETAILED DESCRIPTION

Figure 1:
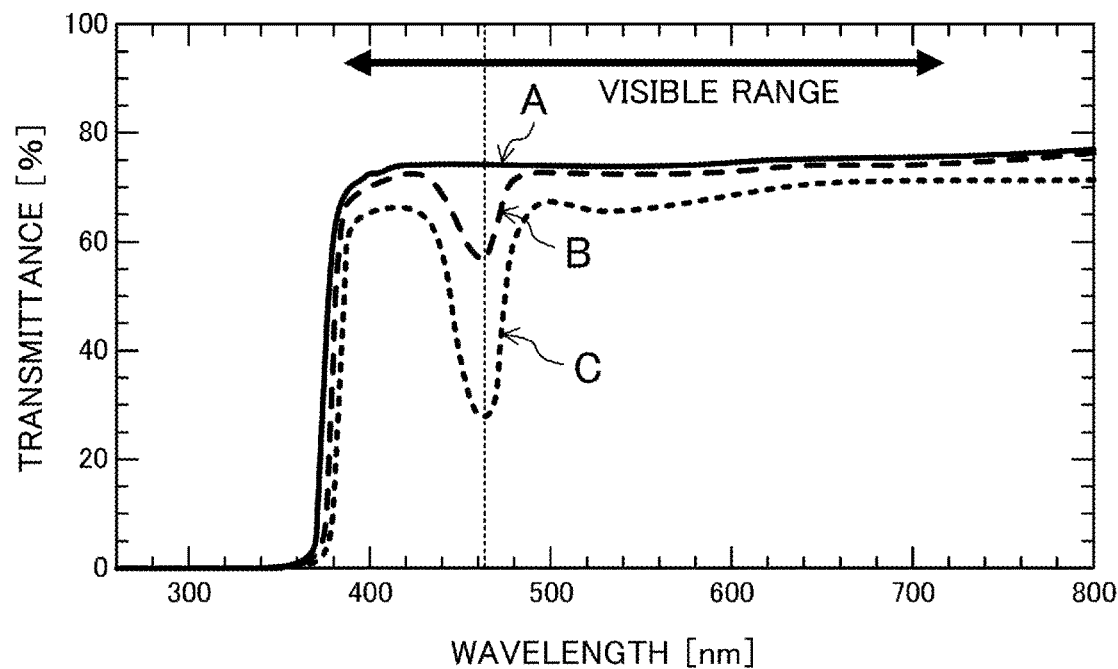
FIG. 1 shows graphs of measurement results of light transmission spectra of 4H-SiC single crystals.

Hereinafter, an embodiment of the present disclosure will be described in detail based on the drawings. Note that the present disclosure is not limited to the following embodiment. Moreover, changes can be made as necessary without departing from a scope in which the advantageous effects of the present disclosure are provided. FIG. 1 shows graphs showing measurement results of light transmission spectra of 4H-SiC single crystals. Measurement is performed using a spectrophotometer, and the vertical axis represents a transmittance and the horizontal axis represents a wavelength. Graphs indicated by arrows A, B, C in the figure each show measurement results of SiC single crystals with n-type impurity (nitrogen) densities of $1 \times 10^{16}$ cm$^{-3}$, $2 \times 10^{18}$ cm$^{-3}$, and $5 \times 10^{18}$ cm$^{-3}$. Note that the n-type impurity density of a SiC single crystal ingot which can be commercially utilized for manufacturing a semiconductor device is normally within a range of $2 \times 10^{18}$ cm$^{-3}$ to $8 \times 10^{18}$ cm$^{-3}$.

As shown in FIG. 1, the graph indicated by the arrow A shows no light absorption in a visible range, but the graphs indicated by the arrows B, C show light absorption (a decrease in the transmittance) at a wavelength of about 460 nm. Moreover, light absorption increases as the n-type impurity density increases. That is, light absorption occurs at a wavelength of about 460 nm in the SiC single crystals with n-type impurity densities of 2 ×10$^{18}$ cm$^{-3}$ and 5 ×10$^{18}$ cm$^{-3}$. This is a cause for coloring in amber.

Figure 2:
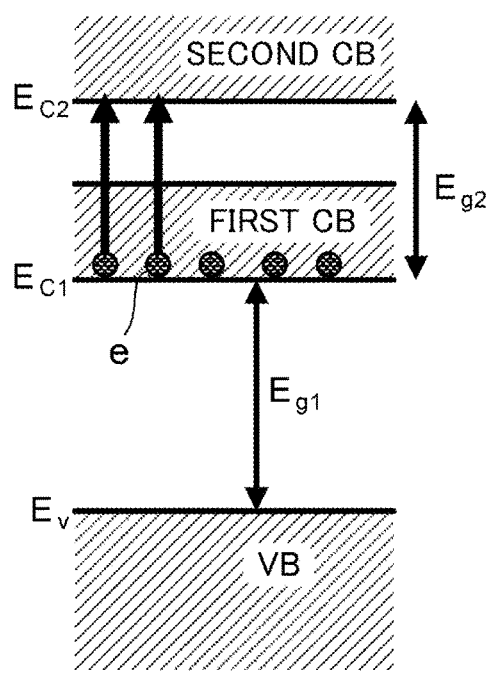
FIG. 2 shows a view of a band structure of an n-type SiC single crystal.

FIG. 2 shows a view showing a band structure of the n-type 4H-SiC single crystal. The SiC single crystal has a first conduction band (FIRST CB) and a second conduction band (SECOND CB), and electrons e excited from the level (not shown) of an n-type impurity are present in the first conduction band.

Light having entered the SiC single crystal excites the electrons in the vicinity of the bottom of the first conduction band to the vicinity of the bottom of the second conduction band. An energy gap $E_{g2}$ between the energy level $E_{c1}$ of the bottom of the first conduction band and the energy level $E_{c2}$ of the bottom of the second conduction band is about 2.7 eV. 2.7 eV is equivalent to light energy with a wavelength of 460 nm. Thus, in the SiC single crystal doped with the n-type impurity, light absorption occurs at a wavelength of 460 nm. Moreover, as the n-type impurity density increases, the number of electrons in the vicinity of the bottom of the first conduction band increases, and accordingly, light absorption increases.

The inventor(s) et al. of the present disclosure has focused on a phenomenon that when the SiC single crystal is irradiated with an electron beam, a Si atom and a C atom are flicked and a vacancy and a lattice defect of an interstitial atom are generated. The mass of the C atom is smaller than the mass of the Si atom, and for this reason, electron energy necessary for flicking the atom is smaller in the C atom than the Si atom. Thus, in a case where the SiC single crystal is irradiated with the electron beam, generation of a carbon vacancy and an interstitial carbon atom becomes dominant. The interstitial carbon atom generated once has an extremely great diffusion constant, and moves to a SiC crystal surface due to a temperature increase upon electron beam irradiation and intentional thermal treatment after electron beam irradiation. Thus, almost no interstitial carbon atom remains in the SiC single crystal. The SiC single crystal is irradiated with the electron beam so that only the carbon vacancy can be substantially selectively generated.

Note that the "SiC single crystal including the carbon vacancy" in the present embodiment includes not only a SiC single crystal in a case where there is a single carbon vacancy at a lattice point, but also a SiC single crystal in a case where multiple carbon vacancies are continuously present. Further, the "SiC single crystal including the carbon vacancy" includes a SiC single crystal in a case where a defect including a pair of a carbon vacancy and a silicon vacancy is present.

Figure 3:
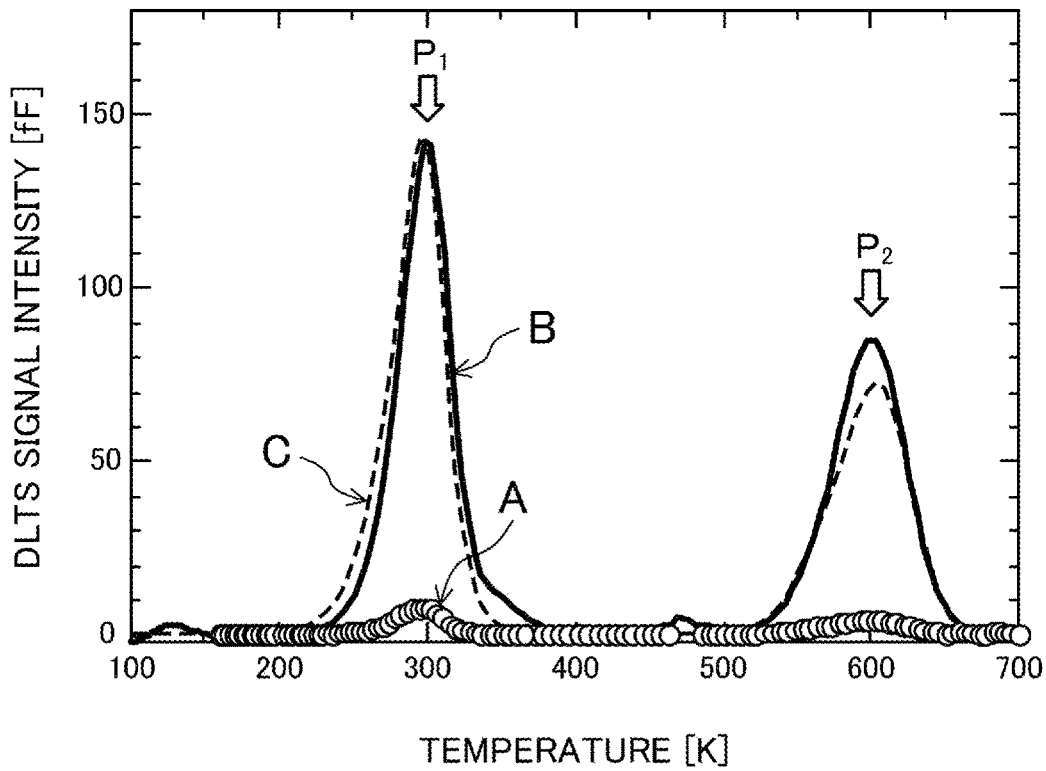
FIG. 3 shows, using a DLTS method, DLTS spectra of measurement results of the defect level of the 4H-SiC single crystal irradiated with an electron beam.

FIG. 3 shows, using a deep level transient spectroscopy (DLTS) method, DLTS spectra of measurement results of the defect level of the 4H-SiC single crystal irradiated with the electron beam, the vertical axis representing a DLTS signal intensity and the horizontal axis representing a temperature. The spectrum indicated by an arrow A in the figure shows the measurement results before electron beam irradiation, the spectrum indicated by an arrow B shows the measurement results after electron beam irradiation, and the spectrum indicated by an arrow C shows the measurement results upon thermal treatment after electron beam irradiation.

Electron beam irradiation as described herein is performed under a condition of an irradiation energy of 200 keV and an irradiation dose of 1 ×10$^{16}$ cm$^{-3}$. Moreover, the thermal treatment is performed for 30 minutes in nitrogen atmosphere at 950° C.

As shown in FIG. 3, the DLTS spectrum of the SiC single crystal after electron beam irradiation shows two peaks indicated by arrows $P_1$, $P_2$. Even when the thermal treatment is performed after electron beam irradiation, these two peaks show little change.

These two peaks are assumed as electron traps due to carbon vacancies generated in the SiC single crystal by electron beam irradiation. From temperatures at which the two peaks are shown, it is assumed that in the band structure of the SiC single crystal after electron beam irradiation, defect levels $E_{D1}$ ($E_{C1}$−$E_{D1}$=0.6 eV), $E_{D2}$ ($E_{C1}$−$E_{D2}$=1.5 eV) due to carbon vacancies are present as shown in FIG. 4.

Figure 4:
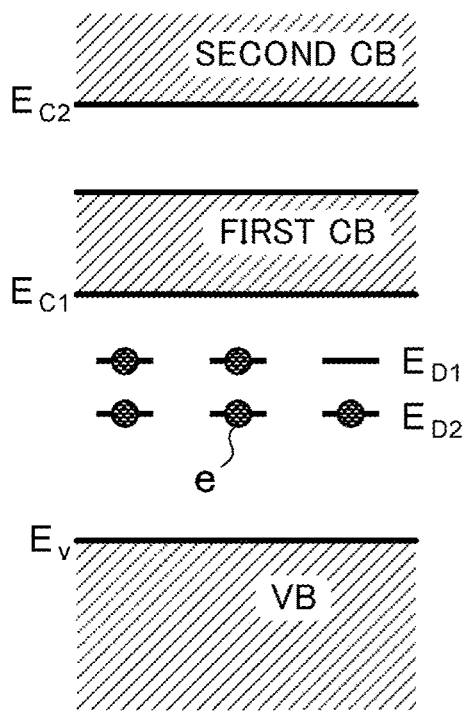
FIG. 4 shows a view of the band structure of the SiC single crystal after electron beam irradiation.

Thus, as shown in FIG. 4, if the electrons excited from the level of the n-type impurity are trapped by these defect levels $E_{D1}$, $E_{D2}$, the electrons can be no longer present in the first conduction band. As a result, light absorption at 460 nm due to excitation of the electrons in the first conduction band to the second conduction band as shown in FIG. 2 can be eliminated.

The present disclosure has been made based on such findings, and is intended to provide a colorless SiC single crystal including an n-type impurity in such a manner that a carbon vacancy is generated in the SiC single crystal by irradiation of the SiC single crystal including the n-type impurity with an electron beam and light absorption at 460 nm is eliminated by trapping of electrons excited from the level of the n-type impurity to the defect level of the carbon vacancy.

Figure 5:
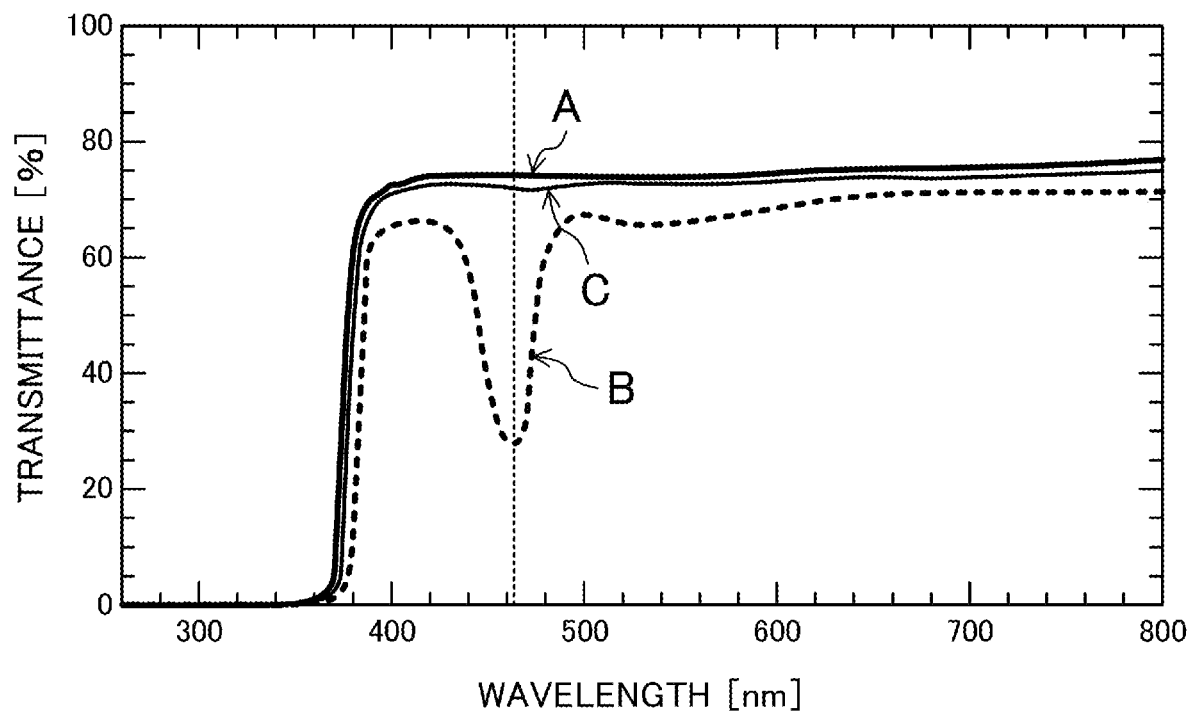
FIG. 5 shows graphs of measurement results of a light transmission spectrum after the SiC single crystal including an n-type impurity has been irradiated with the electron beam.

FIG. 5 shows graphs showing measurement results of a light transmission spectrum after the SiC single crystal including the n-type impurity has been irradiated with the electron beam. The graph indicated by an arrow B in the figure shows the measurement results of the SiC single crystal (an n-type impurity density of 5×10$^{18}$ cm$^{-3}$) before electron beam irradiation, and the graph indicated by an arrow C shows the measurement results after electron beam irradiation (an irradiation energy: 1 MeV, an irradiation dose: 4.5×10$^{18}$ cm$^2$). Note that the graph indicated by an arrow A in the figure shows the measurement results of the SiC single crystal including a low density of the n-type impurity (1 ×10$^{16}$ cm$^{-3}$).

As shown in FIG. 5, the graph indicated by the arrow B shows light absorption at 460 nm, but the graph indicated by the arrow C shows very little light absorption at 460 nm. That is, the SiC single crystal including a certain amount of n-type impurity is irradiated with the electron beam such that light absorption at 460 nm is eliminated, and in this manner, the colorless SiC single crystal can be provided.

As shown in FIG. 2, in the SiC single crystal including the n-type impurity, the density of the electrons in the first conduction band is substantially equal to the n-type impurity density at room temperature. Thus, as shown in FIG. 4, the density of the carbon vacancy is preferably higher than at least the density of the n-type impurity for the purpose of providing the colorless SiC single crystal by elimination of light absorption at 460 nm by trapping of the electrons at the defect level of the carbon vacancy.

The amount of carbon vacancy generated by electron beam irradiation increases as the irradiation energy and dose in electron beam irradiation increase. Thus, for the purpose of providing the colorless SiC single crystal by elimination of light absorption at 460 nm, the irradiation energy and dose in electron beam irradiation may be set such that the density of the carbon vacancy is higher than at least the density of the n-type impurity.

The presence of the carbon vacancy generated in the SiC single crystal and the density of the carbon vacancy can be measured using the DLTS method in a case where the carbon vacancy density is low. In a case where the carbon vacancy density is high, an electron spin resonance (ESR) method can be employed for measurement.

Figure 6:
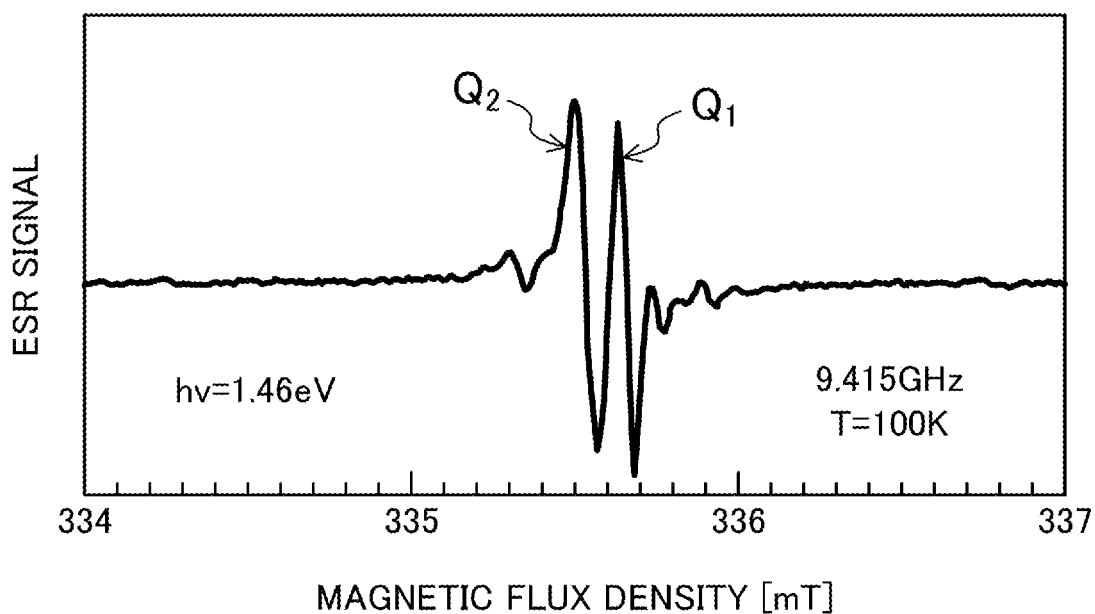
FIG. 6 shows, using an ESR method, a graph of measurement results of a crystal defect generated in the SiC single crystal irradiated with the electron beam.

FIG. 6 shows a graph of example measurement results, which are obtained using the ESR method, of the level of the defect generated in the SiC single crystal irradiated with the electron beam, the vertical axis representing an ESR signal and the horizontal axis representing a magnetic flux density. As shown in FIG. 6, from an ESR spectrum of the SiC single crystal irradiated with the electron beam, two peaks indicated by arrows $Q_1$, $Q_2$ are observed. It is assumed that these peaks result from the defect level of the carbon vacancy generated in the SiC single crystal by electron beam irradiation. Moreover, from the height of the ESR signal at each of the two peaks, the density of the carbon vacancy generated is estimated as about $8 \times 10^{17}$ cm$^{-3}$.

According to the present embodiment, the colored SiC single crystal doped with the n-type impurity is irradiated with the electron beam, and in this manner, a certain density of the carbon vacancy is generated in the SiC single crystal. The electrons excited from the level of the n-type impurity are trapped at the defect level of the carbon vacancy, and in this manner, light absorption, which is unique to the SiC single crystal including the n-type impurity, at 460 nm can be eliminated. In this manner, the colorless SiC single crystal can be provided.

The colorless SiC single crystal obtained as described above can be provided as a synthetic gem crystal, and is cut into an appropriate size so that a colorless clear synthetic gem can be produced. Using this method, the shining colorless clear synthetic gem can be provided at a relatively-low cost by means of the SiC single crystal ingot which can be commercially utilized for manufacturing the semiconductor device.

Since the SiC single crystal ingot is a bulk single crystal, a certain density of the carbon vacancy needs to be generated across the entirety of the bulk single crystal for the purpose of obtaining the colorless clear synthetic gem by cutting of the SiC single crystal ingot.

Figure 7:
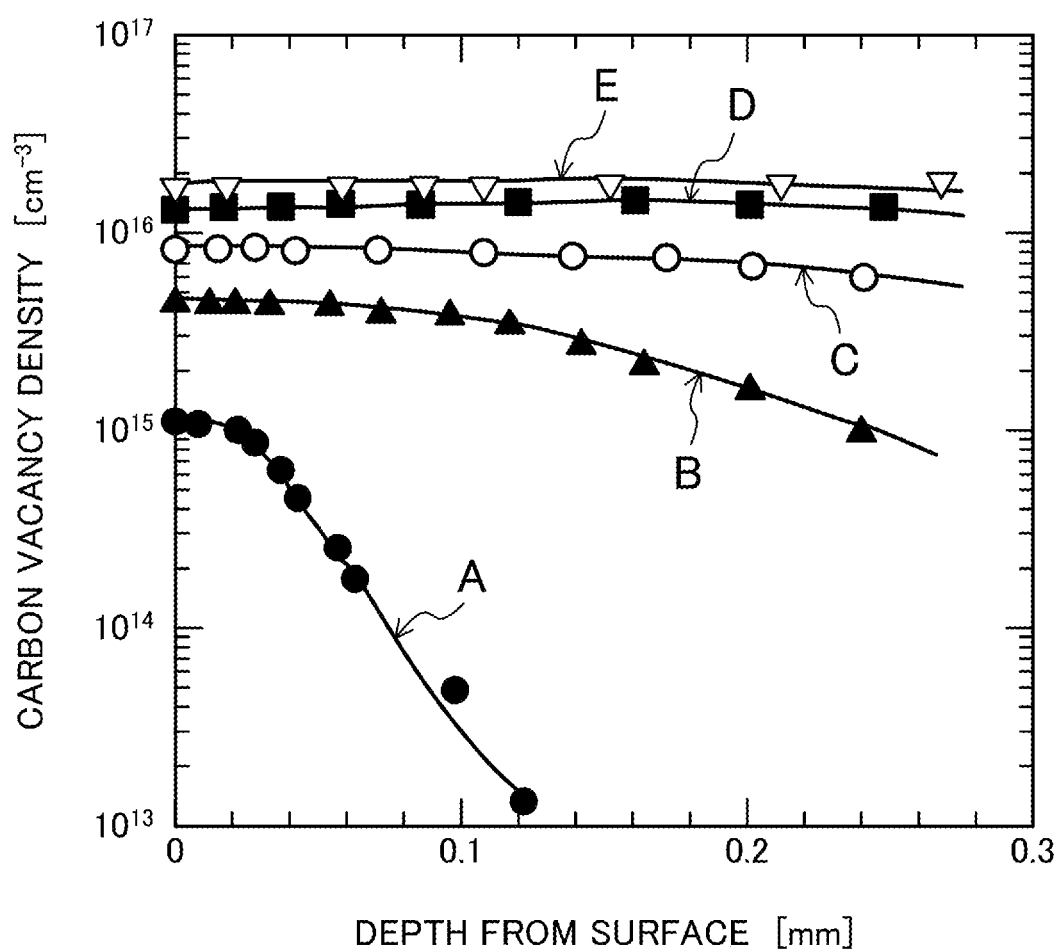
FIG. 7 shows graphs of measurement results of distribution of a carbon vacancy density in a depth direction, a carbon vacancy being generated in the SiC single crystal by irradiation of the SiC single crystal with the electron beam.

FIG. 7 shows graphs of measurement results of distribution of the carbon vacancy density in a depth direction, the carbon vacancy being generated in the SiC single crystal by irradiation of the SiC single crystal with the electron beam. The vertical axis represents the density of the carbon vacancy generated, and the horizontal axis represents a depth from the surface. Measurement is, using the DLTS method, performed while the SiC single crystal is being repeatedly polished in the depth direction. The graphs indicated by arrows A, B, C, D, E in the figure each show the results when the irradiation energy in electron beam irradiation is 250 eV, 500 eV, 750 eV, 1.0 MeV, and 3.0 MeV. Moreover, the irradiation dose in electron beam irradiation is $1 \times 10^{16}$ cm$^{-3}$ in all cases.

As shown in FIG. 7, the carbon vacancy can be generated deeper in the SiC single crystal as the irradiation energy increases. Moreover, as the irradiation energy increases, the amount of carbon vacancy generated increases. Note that the irradiation dose is $1 \times 10^{16}$ cm$^{-3}$ in measurement of FIG. 7, but the amount of carbon vacancy generated can be increased by an increase in the irradiation dose.

As described above, for the purpose of providing the colorless clear SiC single crystal by irradiation of the SiC single crystal including the n-type impurity with the electron beam, the irradiation energy and dose in electron beam irradiation may be set such that the carbon vacancy density necessary for eliminating light absorption at 460 nm is provided across the entirety of the SiC single crystal.

Figure 8:
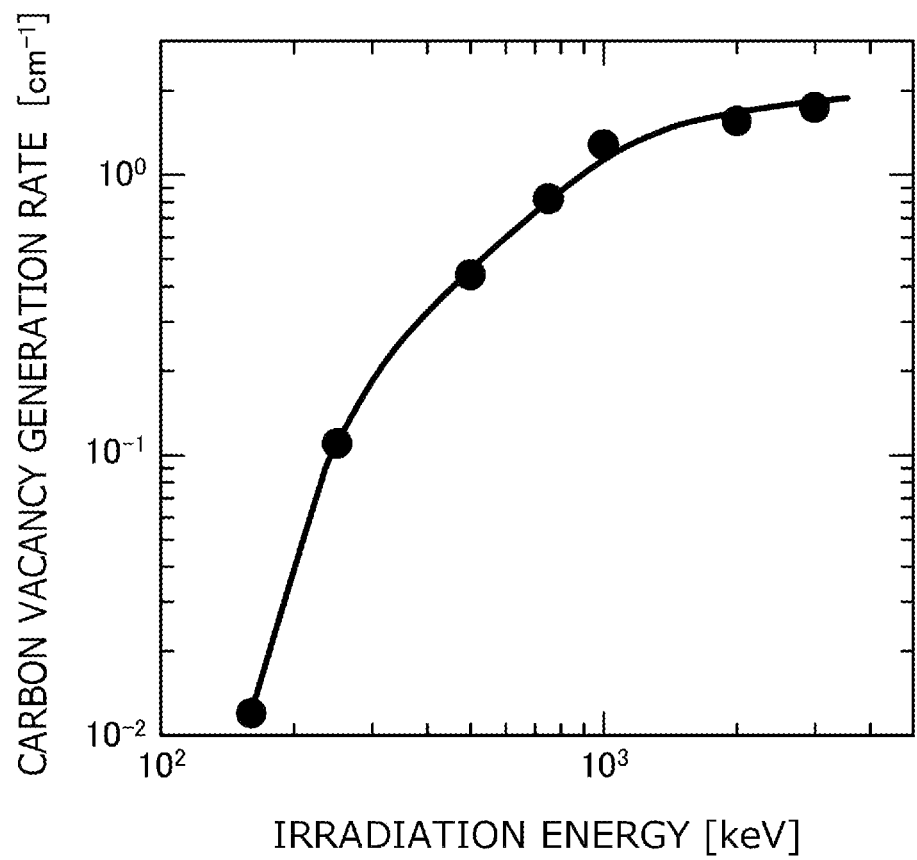
FIG. 8 shows a graph of a relationship between the rate of the carbon vacancy generated in the SiC single crystal by electron beam irradiation and an irradiation energy in electron beam irradiation.

FIG. 8 shows a graph of a relationship between the rate of the carbon vacancy generated in the SiC single crystal by electron beam irradiation and the irradiation energy in electron beam irradiation. The carbon vacancy generation rate as described herein is obtained according to Expression (1) below:

$$\text{Carbon Vacancy Generation Rate (cm}^{-1}\text{)} = \frac{\text{Generated Carbon Vacancy Density (cm}^{-3}\text{)}}{\text{Irradiation Dose in Electron Beam Irradiation (cm}^{-2}\text{)}}, \quad \text{(Expression 1)}$$

where the carbon vacancy density at the numerator of (Expression 1) is a value in the vicinity of the surface of the SiC single crystal irradiated. In a region deep from the surface, the carbon vacancy density decreases as shown in FIG. 7.

As shown in FIG. 8, the carbon vacancy generation rate increases as the irradiation energy in electron beam irradiation increases. The density of the carbon vacancy generated as described herein is substantially proportional to the irradiation dose in electron beam irradiation. Thus, with the known carbon vacancy density necessary for eliminating light absorption at 460 nm, the irradiation dose necessary for the irradiation energy in electron beam irradiation can be obtained from the graph of FIG. 8. For example, the irradiation dose necessary for generating the carbon vacancy at a density of $5 \times 10^{18}$ cm$^{-3}$ by electron beam irradiation with an irradiation energy of 1 MeV is $3.9 \times 10^{18}$ cm$^{-2}$ ($5 \times 10^{18}$ cm$^{-3}$/1.28 cm$^{-1}$).

Figure 9:
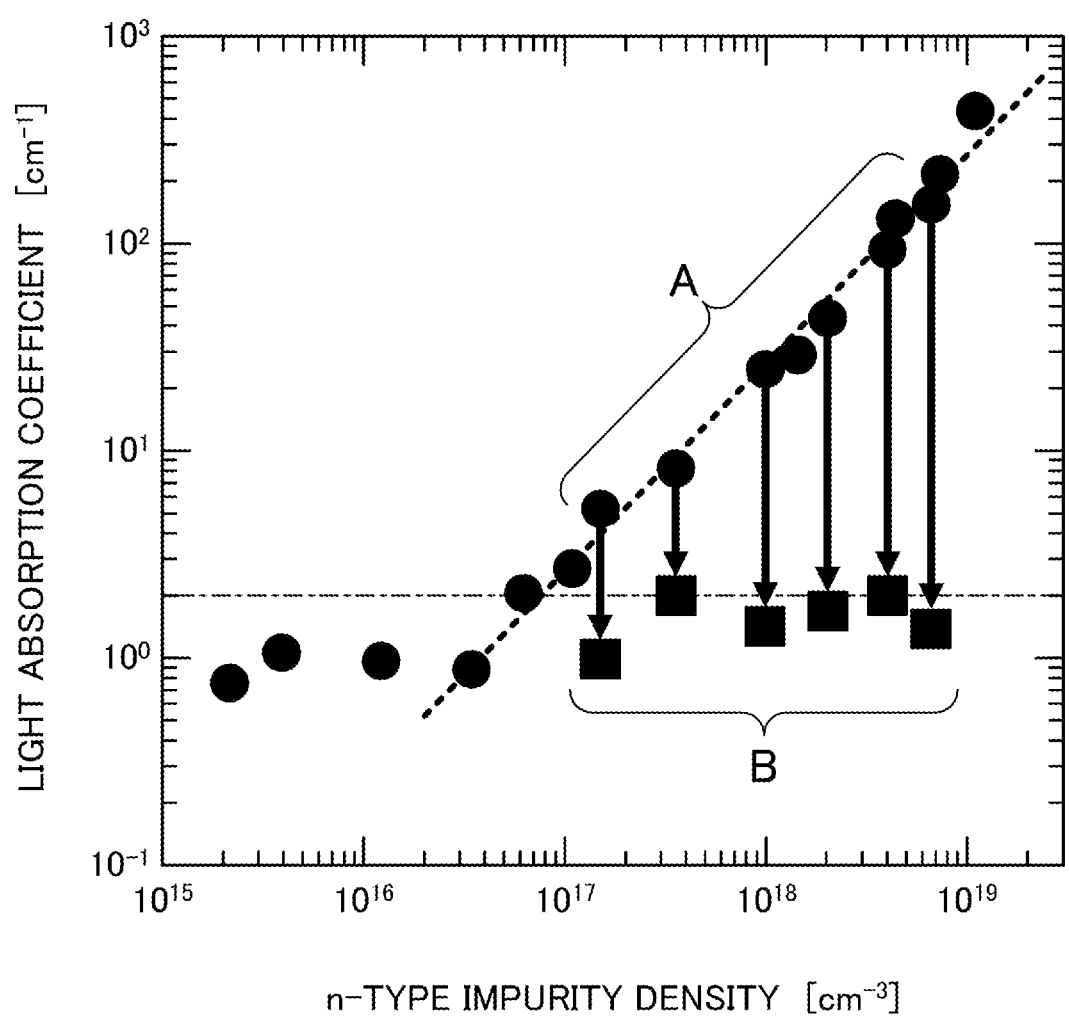
FIG. 9 shows a graph of a relationship between a light absorption coefficient at a wavelength of 460 nm in the SiC single crystal and the density of the n-type impurity doped to the SiC single crystal.

FIG. 9 shows a graph of a relationship between a light absorption coefficient at a wavelength of 460 nm in the SiC single crystal and the density of the n-type impurity doped to the SiC single crystal. Measurement is performed using the spectrophotometer, and the vertical axis represents the light absorption coefficient and the horizontal axis represents the n- type impurity density.

As shown in FIG. 9, the light absorption coefficient at a wavelength of 460 nm is substantially proportional to the n-type impurity density when the n-type impurity density is $7 \times 10^{16}$ cm' or higher. The light absorption coefficient is 2 cm$^{-1}$ or lower in the case of the SiC single crystal with an n-type impurity density of $7 \times 10^{16}$ cm$^{-3}$ or lower. Even in the case of the SiC single crystal with a thickness of 5 mm, light can penetrate such a SiC single crystal, and the SiC single crystal is clear. On the other hand, the light absorption coefficient is 5 cm$^{-1}$ or higher in the case of the SiC single crystal with an n-type impurity density of $1 \times 10^{17}$ cm$^{-3}$ or higher. In the case of the SiC single crystal with a thickness of 2 mm or greater, such a SiC single crystal is not colorless clear.

The present disclosure provides a technique effective for changing the colored unclear SiC single crystal into the colorless clear SiC single crystal. That is, as shown in FIG. 9, the SiC single crystal including the n-type impurity within a range (an n-type impurity density of $1 \times 10^{17}$ cm$^{-2}$ or higher) indicated by A is irradiated with the electron beam, and in this manner, such a SiC single crystal can be changed into the colorless clear SiC single crystal whose light absorption coefficient at a wavelength of 460 nm is 2 cm$^{-1}$ or lower as in a range indicated by B. Note that in a case where the n-type impurity density is $5 \times 10^{17}$ cm$^{-2}$ or higher, the light absorption coefficient at a wavelength of 460 nm is 10 cm$^{-1}$ or higher. Thus, the advantageous effects of the present disclosure are further exerted.

The irradiation energy and dose in electron beam irradiation as described herein may be set such that the carbon vacancy density is higher than the n-type impurity density. Moreover, the irradiation energy in electron beam irradiation may be determined as necessary according to the thickness of the SiC single crystal.

The SiC single crystal ingot which can be commercially utilized for manufacturing the semiconductor device normally has an n-type impurity density of $1\times10^{18}$ cm$^{-3}$ or higher. The present disclosure is particularly effective for changing the SiC single crystal with such a high n-type impurity density into the colorless clear SiC single crystal, and is applied so that the colorless clear synthetic gem crystal can be provided at a relatively-low cost.

The SiC single crystal ingot can be produced without addition of the n-type impurity. However, even in such an additive-free SiC single crystal ingot, nitrogen as the n-type impurity is normally present as a residual impurity at a density of $1\times10^{17}$ cm$^{-3}$ to $5\times10^{17}$ cm$^{-3}$. Thus, such a SiC single crystal ingot is colored in light amber. Such a low-nitrogen-density SiC single crystal ingot can be easily changed into the colorless clear SiC single crystal ingot by generation of a slight amount of carbon vacancy. Thus, the irradiation dose in electron beam irradiation can be decreased, and the colorless clear synthetic gem crystal can be provided at a lower cost.

FIG. 10A to FIG. 10D show views of the method for manufacturing the synthetic gem crystal in the present embodiment.

Figure 10A:
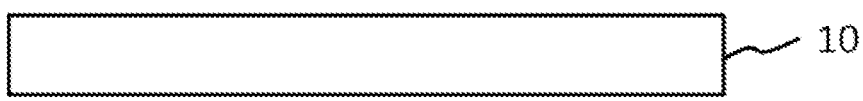
FIG. 10A to FIG. 10D show views of the method for manufacturing a synthetic gem crystal.

First, as shown in FIG. 10A, a SiC single crystal 10 including an n-type impurity is prepared. For example, as the SiC single crystal 10, a SiC single crystal ingot which can be commercially utilized for manufacturing a semiconductor device can be used.

Figure 10B:
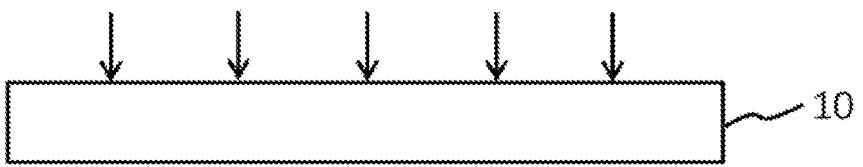
Figure 10C:
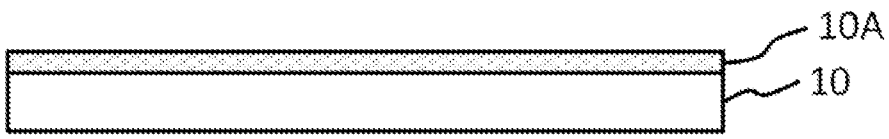

Next, as shown in FIG. 10B, the SiC single crystal 10 is irradiated with electron beams, and in this manner, carbon vacancies are generated in the SiC single crystal 10. Irradiation energy and dose in electron beam irradiation as described herein are set such that a carbon vacancy density is higher than an n-type impurity density. In this manner, a defect region 10A with the generated carbon vacancies is formed under a surface of the SiC single crystal 10 as shown in FIG. 10C. Note that in a case where the SiC single crystal 10 is thin, the defect region 10A is formed across the entirety of the SiC single crystal 10.

Figure 10D:
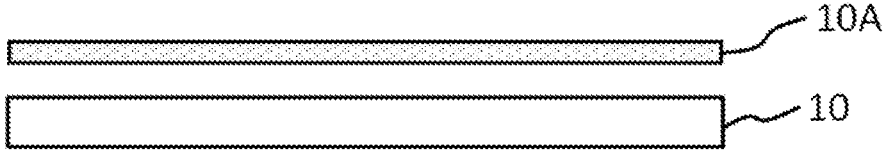

Next, as shown in FIG. 10D, the defect region 10A of the SiC single crystal 10 is cut out. The defect region 10A can be cut out in such a manner that an interface between the defect region 10A and the SiC single crystal 10 is cut with a thin diamond wire saw, for example. The cut defect region 10A can be provided as a colorless clear synthetic gem crystal, and can be cut into an appropriate size to produce a colorless clear synthetic gem. Note that the remaining SiC single crystal 10 can be reutilized as a raw material. For example, such a SiC single crystal 10 is irradiated with electron beams so that a surface region can be changed into a colorless clear region and can be provided as a synthetic gem crystal. Moreover, such a SiC single crystal 10 can be also utilized for another purpose (e.g., a substrate for manufacturing the semiconductor device).

Note that when the SiC single crystal 10 is irradiated with the electron beams, slight interstitial carbon atoms might remain in addition to generation of the carbon vacancies. In this case, due to the interstitial carbon atoms, slight light absorption occurs and might lead to degradation of the degree of clearness. For this reason, for the purpose of preventing degradation of the degree of clearness, thermal treatment may be performed for the SiC single crystal 10 at a temperature of 500° C. to 1400° C. after the step of generating the carbon vacancies.

The present disclosure has been described above with reference to the preferred embodiment, but such description is not a limited matter and various modifications can be made, needless to say. For example, in the above-described embodiment, the 4H-SiC single crystal has been described. However, in a 6H-SiC single crystal, a carbon vacancy can be also generated by electron beam irradiation. The amount of carbon vacancy generated is the same as that in the case of the 4H-SiC single crystal, and therefore, advantageous effects similar to those of the 4H-SiC single crystal can be obtained.

The carbon vacancy generated in the SiC single crystal by electron beam irradiation is not necessarily uniformly distributed, and it may only be required that the density of carbon vacancy necessary for eliminating light absorption at 460 nm is present.

The carbon vacancy generated by electron beam irradiation is not necessarily present across the entirety of the SiC single crystal, and it may only be required that the carbon vacancy is present in a region with a certain depth. In this case, only the SiC single crystal region where the carbon vacancy is generated is cut out, and in this manner, the colorless clear synthetic gem crystal can be obtained.

The SiC single crystal used for the synthetic gem crystal is not limited to the SiC single crystal ingot which can be commercially utilized for manufacturing the semiconductor device. The SiC single crystal may be SiC single crystals manufactured for other purposes, or may be a SiC single crystal manufactured for the synthetic gem, needless to say.

What is claimed is:

1. A method for manufacturing a synthetic gem composed of a SiC single crystal, comprising:
    a step (A) of preparing a SiC single crystal including nitrogen with a density of $1\times10^{17}$ cm$^{-3}$ or more; and
    a step (B) of irradiating the SiC single crystal with an electron beam to produce a defect region where a carbon vacancy is generated, under a surface of the SiC single crystal, and
    a step (C) of cutting out the defect region from the SiC single crystal to produce the synthetic gem composed of the SiC single crystal that is colorless and clear with a light absorption coefficient at a wavelength of 460 nm of 2 cm$_{-1}$ or lower,
    wherein, in the step (B), irradiation energy and dose in electron beam irradiation are set such that a density of the carbon vacancy is higher than a density of the nitrogen.

2. The method for manufacturing the synthetic gem according to claim 1, further comprising:
    a step of performing, after the step (B) and before the step (C), thermal treatment for the SiC single crystal at a temperature of 500° C. to 1400° C.

* * * * *